(12) United States Patent
Chang et al.

(10) Patent No.: US 8,999,614 B2
(45) Date of Patent: Apr. 7, 2015

(54) PHOTORESIST COMPOSITION FOR FORMING A COLOR FILTER AND DISPLAY SUBSTRATE

(71) Applicant: Samsung Display Co., Ltd., Yongin, Gyeonggi-Do (KR)

(72) Inventors: Sun-Young Chang, Gwangmyeong-si (KR); Sang-Hun Lee, Suwon-si (KR); Yui-Ku Lee, Seoul (KR); Chul Huh, Yongin-si (KR)

(73) Assignee: Samsung Display Co., Ltd. (KR)

( * ) Notice: Subject to any disclaimer, the term of this patent is extended or adjusted under 35 U.S.C. 154(b) by 360 days.

(21) Appl. No.: 13/665,626

(22) Filed: Oct. 31, 2012

(65) Prior Publication Data

US 2013/0155536 A1    Jun. 20, 2013

(30) Foreign Application Priority Data

Dec. 16, 2011   (KR) ................. 10-2011-0135978

(51) Int. Cl.
*G03F 7/004* (2006.01)
*G02B 5/20* (2006.01)
*G02B 5/22* (2006.01)
*G03F 7/00* (2006.01)
*G03F 7/105* (2006.01)

(52) U.S. Cl.
CPC .............. *G02B 5/223* (2013.01); *G03F 7/0007* (2013.01); *G03F 7/105* (2013.01)

(58) Field of Classification Search
None
See application file for complete search history.

(56) References Cited

U.S. PATENT DOCUMENTS

| 2007/0090331 | A1* | 4/2007 | Seo et al. | 252/587 |
|---|---|---|---|---|
| 2011/0304804 | A1* | 12/2011 | Lee et al. | 349/106 |
| 2012/0161087 | A1* | 6/2012 | Jung et al. | 252/586 |

FOREIGN PATENT DOCUMENTS

| JP | 10-123316 A | * | 5/1998 |
|---|---|---|---|
| JP | 2010189560 A | | 9/2010 |
| KR | 19990076015 A | | 10/1999 |
| KR | 1020010102989 A | | 11/2001 |
| KR | 1020090073936 A | | 7/2009 |

OTHER PUBLICATIONS

Computer-generated translation of JP 10-123316 (May 1998).*

* cited by examiner

Primary Examiner — John A. McPherson
(74) Attorney, Agent, or Firm — Cantor Colburn LLP (57) ABSTRACT

A photoresist composition for manufacturing a color filter, the photoresist composition includes a first red colorant and a yellow colorant represented by Chemical Formula 1, Chemical Formula 1 wherein $R_1$ and $R_2$ each independently represent a C1 to C10 alkyl group, wherein $A_1$, $A_2$, $A_3$, and $A_4$ each independently represent a C1 to C10 alkyl group, —CN, —$PO_3H_2$, —C(O)OH, or a hydrogen atom, m is an integer of 1 to 10, and optionally wherein at least one —$CH_2$— of $R_1$ and $R_2$ if present is independently replaced with —O—, —C(O)—, —C(O)O—, or —OC(O)—.

20 Claims, 4 Drawing Sheets

PHOTORESIST COMPOSITION FOR FORMING A COLOR FILTER AND DISPLAY SUBSTRATE

This application claims priority to Korean Patent Application No. 10-2011-0135978, filed on Dec. 16, 2011 and all the benefits accruing therefrom under 35 U.S.C. §119, the contents of which in its entirety is herein incorporated by reference.

BACKGROUND

1. Field

This disclosure relates to a photoresist composition for manufacturing a color filter and a display substrate. Additionally this disclosure relates to a photoresist composition for manufacturing a color filter used for a display apparatus and a display substrate.

2. Description of the Related Art

Generally, a display apparatus includes a display panel displaying an image using light and a light providing assembly providing the light to the display panel. The display panel includes a planarity of pixel cells, a switching element, a pixel electrode, a common electrode and a color filter. The display panel may use a liquid crystal as a display element.

A white light provided to the display panel from the light providing assembly passes through a liquid crystal layer including the liquid crystal and the color filter so that the display panel displays a color image generated from a variable color mixture of light. For example, the display panel includes a red color filter ("R"), a green color filter ("G") and a blue color filter ("B"), and three color lights, which are converted by the color filters of the display panel are mixed to represent various colors.

A pigment as a colorant representing a color has been used in each of the color filters. However, recently, a dye is used with the pigment in order to improve the brightness. Although a hybrid type colorant including the pigment and the dye is used, the brightness is marginally improved. In order to solve the above problem, a dye having a high luminance may be used to maximize the brightness while excluding the pigment.

When the colorant includes only the dye, an entire brightness may be improved. However, a black brightness is increased so that the contrast ratio is undesirably decreased. Thus, there remains a need for an improved colorant.

SUMMARY

In an embodiment a photoresist composition for manufacturing a color filter capable of controlling a fluorescence of a colorant to improve a contrast ratio is provided.

In another embodiment a display substrate including a color filter manufactured by the photoresist composition is provided.

According to an embodiment, a photoresist composition for manufacturing a color filter includes a first red colorant; and a yellow colorant represented by Chemical Formula 1, Chemical Formula 1 wherein $R_1$ and $R_2$ each independently represent a C1 to C10 alkyl group, wherein $A_1, A_2, A_3,$ and $A_4$ each independently represent a C1 to C10 alkyl group, —CN, —$PO_3H_2$, —C(O)OH, or a hydrogen atom, m is an integer of 1 to 10, and optionally wherein at least one —$CH_2$— of $R_1$ and $R_2$ if present is independently replaced with —O—, —C(O)—, —C(O)O—, or —OC(O)—.

In an embodiment, the first red colorant of the photoresist composition may be represented by Chemical Formula 2, Chemical Formula 2 wherein $R_3$ and $R_4$ each independently represent a C1 to C10 alkyl group, wherein $A_1, A_2, A_3,$ and $A_4$ each independently represent a C1 to C10 alkyl group, —CN, —$PO_3H_2$, —C(O)OH, or a hydrogen atom, m is an integer of 1 to 10, and optionally wherein at least one —$CH_2$— of $R_3$ and $R_4$ if present is independently replaced with —O—, —C(O)—, —C(O)O— or —OC(O)—.

In an embodiment, the photoresist composition may further include a second red colorant having a different structure from the first red colorant. For example, the second red colorant may include at least one of a xanthene compound, a cyanine compound, an azo compound, a perylene compound, or a compound represented by Chemical Formula 3.

Chemical Formula 3

In Chemical Formula 3, n may represent an integer of 3 or 4.

In another embodiment, the first red colorant of the photoresist composition may include at least one of a xanthene compound, a cyanine compound, an azo compound, a perylene compound or a compound represent by the above Chemical Formula 3. A second red colorant may be included in the photoresist composition, and the second red colorant may be a different compound from the first red colorant, and may include at least one of a xanthene compound, a cyanine compound, an azo compound, a perylene compound or a compound represented by the above Chemical Formula 3.

In an embodiment, the photoresist composition may further include a photo-polymerization initiator, a monomer, a binder, and a solvent.

According to another embodiment, a photoresist composition includes a yellow colorant and a first red colorant represented by Chemical Formula 2, Chemical Formula 2 wherein $R_3$ and $R_4$ each independently represent a C1 to C10 alkyl group, wherein $A_1, A_2, A_3,$ and $A_4$ each independently represent a C1 to C10 alkyl group, —CN, —$PO_3H_2$, —C(O)OH, or a hydrogen atom, m is an integer of 1 to 10, and optionally wherein at least one —$CH_2$— of $R_3$ and $R_4$ if present is independently replaced with —O—, —C(O)—, —C(O)O—, or —OC(O)—.

In an embodiment, the photoresist composition may further include a second red colorant represented by Chemical Formula 3,

Chemical Formula 3

In Chemical Formula 3, n may represent an integer of 3 or 4.

According to still another embodiment, a display substrate includes a red color filter including a first red colorant and a yellow colorant represented by Chemical Formula 1, Chemical Formula 1 wherein $R_1$ and $R_2$ each independently represent a C1 to C10 alkyl group, wherein $A_1$, $A_2$, $A_3$, and $A_4$ each independently represent a C1 to C10 alkyl group, —CN, —PO$_3$H$_2$, —C(O)OH, or a hydrogen atom, m is an integer of 1 to 10, and optionally wherein at least one —CH$_2$— of $R_1$ and $R_2$ if present is independently replaced with —O—, —C(O)—, —C(O)O—, or —OC(O)—.

In an embodiment, the first red colorant of the display substrate may be represented by the above Chemical Formula 2. Alternatively, in another embodiment, the first red colorant of the display substrate may include at least one of a xanthene compound, a cyanine compound, an azo compound, a perylene compound or a compound represented by Chemical Formula 3.

Chemical Formula 3

In Chemical Formula 3, n may represent an integer of 3 or 4.

In an embodiment, the red color filter of the display substrate may further include a second red colorant including at least one of a xanthene compound, a cyanine compound, an azo compound, a perylene compound or a compound represented by the above Chemical Formula 3. The second red colorant may be different than the first red colorant.

In an embodiment, the display substrate may further include a switching element disposed on a base substrate and a pixel electrode connected to the switching element, and the red color filter may be disposed between the switching element and the pixel electrode.

In an embodiment, the display substrate may further include a common electrode disposed on the red color filter.

In an embodiment, the red color filter of the display substrate may have a thickness in a range of about 1.0 micrometer (μm) to about 3.5 μm.

According to still another embodiment, the display substrate includes a red color filter including a first red colorant represented by the above Chemical Formula 2 and a yellow colorant.

In an embodiment, the red color filter may further include a second red colorant represented by the above Chemical Formula 3.

According to another embodiment, a fluorescent metal complex including a metal may be used as a red colorant for forming a red color filter. Thus, while not wishing to be bound by theory, it is believed a brightness of a white display mode may be increased and a light emitting intensity of a black display mode may be decreased to improve a contrast ratio.

According to yet another embodiment, a metal complex may be used as a yellow colorant for forming a red color filter so that the red colorant may not irradiate the fluorescence since the energy may become extinct by the yellow colorant when an energy transition is generated in the red colorant. Therefore, while not wishing to be bound by theory, it is believed the brightness of the black display mode may be decreased to improve a contrast ratio.

BRIEF DESCRIPTION OF THE DRAWINGS

The above and other features and advantages of this disclosure will become more apparent by describing in detail embodiments thereof, with reference to the accompanying drawings, in which.

DETAILED DESCRIPTION

The embodiments are described more fully hereinafter, with reference to the accompanying drawings. This disclosure may, however, be embodied in many different forms and should not be construed as limited to the embodiments set forth herein. Rather, these embodiments are provided so that this disclosure will be thorough and complete, and will fully convey the scope of the disclosure to those skilled in the art.

In the drawings, the thickness, size, and relative sizes of layers and regions may be exaggerated for clarity. Like reference numerals refer to like elements throughout.

The terminology used herein is for the purpose of describing particular embodiments only and is not intended to be limiting. As used here, the singular forms "a," "an," and "the" are intended to include the plural forms as well, unless the content clearly indicates otherwise. "Or" includes "and/or." It will be further understood that the terms "comprises" and/or "comprising," or "includes" and/or "including" when used in this specification specify the presence of stated features, regions, integers, steps, operations, elements, and/or components but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning consistent with their meaning in the context of the relevant art, and will not be interpreted in an idealized or overly formal sense unless expressly so defined herein.

Embodiments are described herein with reference to cross sectional illustrations that are schematic illustrations of idealized embodiments (and intermediate structures). As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. A region illustrated as a rectangle may typically have rounded or curved features. Moreover, sharp angles that are illustrated may be rounded. Likewise, a buried region formed by implantation may result in some implantation in the region between the buried region and the surface through which the implantation takes place. Thus, the regions illustrated in the figures are schematic in nature and their shapes are not intended to illustrate the precise shape of a region and are not intended to limit the scope of the present disclosure.

It will be understood that when an element or layer is referred to as being "on", "connected to", or "coupled to" another element or layer, it can be directly on, connected to, or coupled to the other element or layer or intervening elements or layers may be present. When an element or layer is referred to as being "disposed on" or "formed on" another element or layer, the elements or layers are understood to be in at least partial contact with each other, unless otherwise specified. In contrast, when an element or layer is referred to as being "directly on", "directly connected to", or "directly coupled to" another element or layer, the elements are in at least partial contact with each other and there are no intervening elements or layers present. Like numerals refer to like elements or layers throughout. As used herein, the term "and/or" includes any and all combinations of one or more of the associated listed items.

It will be understood that, although the terms "first", "second", "third", and the like do not imply any particular order, but may be used herein to describe various elements, components, regions, layers and/or sections. These elements, components, regions, layers and/or sections should not be limited by these terms. These terms are only used to distinguish one element, component, region, layer and/or section. Thus a first element, component, region, layer and/or section discussed below could be termed a second element, component, region, layer and/or section without departing from the teachings herein.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the apparatus in use or operation in addition to the orientation depicted in the figures. For example, if the apparatus in the figures is turned over, elements described as "beneath", "below", or "lower" other elements or features would then be oriented "above", or "upper" the other elements or features. Thus, the exemplary term "below" can encompass both an orientation above and below. The apparatus may be otherwise oriented (rotated 90 degrees or at other orientations) and the spatially relative descriptors used herein interpreted accordingly.

"Alkyl" means a straight or branched chain, saturated, monovalent hydrocarbon group (e.g., methyl or hexyl). The term "*" represents a point of attachment of the indicated substituent.

Photoresist Composition-1

A photoresist composition for manufacturing a color filter according to an embodiment includes a first red colorant, a yellow colorant and a second red colorant. The first and second red colorants and the yellow colorant may each be a dye. A red reproducibility of a color filter formed using the photoresist composition may be selected by selecting a content of the first red colorant, the second red colorant and the yellow colorant.

The photoresist composition may further include a binder such as a binder resin, a monomer, a photo-polymerization initiator, and a solvent with the first red colorant, the second red colorant, and the yellow colorant.

The first and second red colorants each include an organic compound, which may fluoresce. For example, each of the first and second red colorants may include at least one of a xanthene-based compound, a cyanine-based compound, an azo-based compound, a perylene-based compound or a compound represented by Chemical Formula 3 as the organic compound. In an embodiment, the first red colorant may include the compound represented by Chemical Formula 3, and the second red colorant may include the azo-based compound.

Chemical Formula 3

In Chemical Formula 3, n may represent an integer of 3 or 4.

Because each of the first and second red colorants may fluoresce, a brightness of a display apparatus including a color filter formed using the photoresist composition may be improved, as compared to a photoresist composition including a pigment.

The yellow colorant may be represented by Chemical Formula 1.

Chemical Formula 1

In Chemical Formula 1, $R_1$ and $R_2$ each independently represent a C1 to C10 alkyl group, wherein $A_1, A_2, A_3,$ and $A_4$ each independently represent a C1 to C10 alkyl group, —CN, —$PO_3H_2$, —C(O)OH, or a hydrogen atom, m is an integer of 1 to 10, and optionally wherein at least one —$CH_2$— of $R_1$ and $R_2$ if present is independently replaced with —O—, —C(O)—, —C(O)O— or —OC(O)—.

For example, $R_1$ and/or $R_2$ may be represented by Chemical Formulae 1-1, 1-2, 1-3, 1-4, 1-5, 1-6, 1-7 or 1-8.

Chemical Formula 1-1

Chemical Formula 1-2

Chemical Formula 1-3

Chemical Formula 1-4

Chemical Formula 1-5

Chemical Formula 1-6

Chemical Formula 1-7

Chemical Formula 1-8

According to an embodiment, optionally at least one —$CH_2$— of $R_1$ and $R_2$ can be replaced with —O—, —C(O)—, —C(O)O— or —OC(O)—.

The yellow colorant has a metal complex structure including a metal. The yellow colorant may include chromium (e.g., $Cr^{6+}$). When the first red colorant or the second red colorant receive light of sufficient energy to generate an excited state, the first and the second red colorants either emit light or quench, dissipating the energy absorbed by the first and second red colorants. The yellow colorant has a metal complex structure to support the quenching of the first and second red colorants. While not wishing to be bound by theory, the light-emitting intensity of the first and second red colorants may be decreased by the yellow colorant, and thus the black brightness of the display apparatus may be decreased.

For example, when a total amount of colorants included in the photoresist composition is about 100% by weight, an amount of the first red colorant may be about 25% by weight to about 65% by weight, specifically about 30% by weight to about 60% weight, more specifically about 40% by weight to about 50% by weight, an amount of the second red colorant may be about 25% by weight to about 65% by weight, specifically about 30% by weight to about 60% weight, more specifically about 40% by weight to about 50% by weight, and an amount of the yellow colorant may be about 2% by weight to about 30% by weight, specifically about 4% by weight to about 25% weight, more specifically about 5% by weight and about 20% by weight. The total amount of the colorants included in the photoresist composition may be about 10% by weight to about 60% by weight, specifically about 20% by weight to about 50% by weight, more specifically about 30% by weight to about 40% by weight, based on a total weight of the photoresist composition. According to an embodiment, the total amount of the colorants included in the photoresist composition may be about 30% by weight to about 40% by weight, based on a total weight of the photoresist composition.

Figure 1:
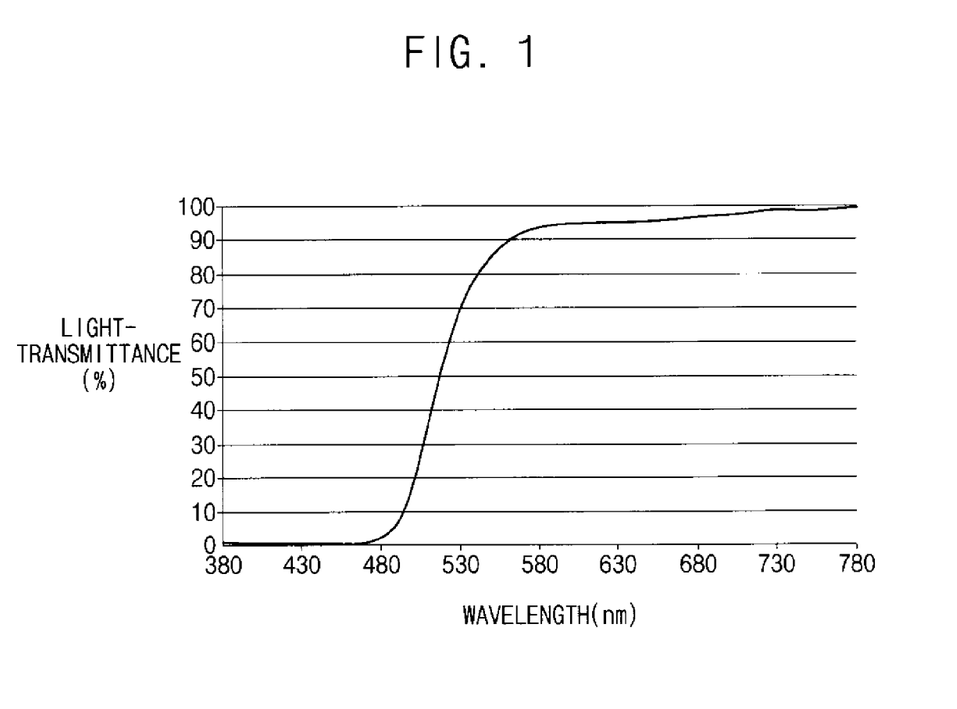
FIG. 1 is a graph illustrating a light-transmittance (percent, %) versus a wavelength (nanometers, m) in a yellow colorant of a photoresist composition for manufacturing a color filter in accordance with an embodiment.

FIG. 1 is a graph illustrating a light-transmittance (percent, %) versus a wavelength (nanometers, m) in a yellow colorant of a photoresist composition for manufacturing a color filter in accordance with an embodiment.

Referring to FIG. 1, a light-transmittance of the yellow colorant according to an embodiment is equal to or greater than about 90% in a wavelength equal to or greater than about 580 nanometers (nm). While not wishing to be bound by theory, the yellow colorant may be used with the first and second red colorants to improve a brightness of a display apparatus including a color filter including the yellow colorant.

For example, when a first display apparatus including a red color filter formed using a first photoresist composition which includes an azo-based compound as the first red colorant and the compound represented by the above Chemical Formula 3 as the second red colorant is compared with a second display apparatus substantially the same as the first display apparatus except for including a red color filter formed using a second photoresist composition which further includes a yellow colorant in addition to the azo-based compound and the compound represented by the above-Chemical Formula 3 of the first photoresist composition, when a brightness of the first display apparatus is defined to be "100%," a brightness of the second display apparatus is increased to be about 106%, with respect to the brightness of the first display apparatus. Simultaneously, a contrast ratio of the second display apparatus is higher than that of the first display apparatus by about six times. While not wishing to be bound by theory, it is believed the yellow colorant having the metal complex structure improves the brightness and the black brightness is decreased, and thus the contrast ratio may be improved.

When a distance between the yellow colorant and the first or second red colorants is decreased, the quenching may be increased. When the yellow colorant is disposed adjacent to the first or second red colorants, the quenching may be facilitated. Thus, when the distance is decreased, the black brightness may be decreased. The distance is dependent on a thickness of a color filter formed using the photoresist composition and thus, the quenching is increased when the thickness of the color filter is decreased.

The binder resin, the monomer, the photo-polymerization initiator and the solvent included in the photoresist composition may be selected by one of skill in the art without undue experimentation. The photoresist composition may include a binder such as a binder resin, a monomer, a photo-polymerization initiator, and/or a solvent. The binder resin may include an acrylic resin, an alkali soluble resin e.g. a novolac resin, or the like. The binder resin is hardened in forming the color filter to define a shape of the color filter.

Examples of the monomer may include ethylene glycol di(meth)acrylate, diethylene glycol di(meth)acrylate, triethylene glycol di(meth)acrylate, propylene glycol di(meth)acrylate, 1,4-butandiol di(meth)acrylate, 1,6-hexandiol di(meth)acrylate, neopentyl glycol di(meth)acrylate, pentaerythritol di(meth)acrylate, pentaerythritol tri(meth)acrylate, pentaerythritol tetra(meth)acrylate, pentaerythritol penta(meth)acrylate, pentaerythritol hexa(meth)acrylate, dipentaerythritol di(meth)acrylate, dipentaerythritol tri(meth)acrylate, dipentaerythritol tetra(meth)acrylate, dipentaerythritol penta(meth)acrylate, dipentaerythritol hexa(meth)acrylate, bisphenol A di(meth)acrylate, trimethylolpropane tri(meth)acrylate, novolac epoxy(meth)acrylate, dipentaerythritol penta(meth)acrylate derivatives having a carboxylic group, glycerin trimethylolpropane tri(meth)acrylate ethyleneoxide, glycerin tri(meth)acrylate propyleneoxide, or the like. These may be used alone or a combination thereof.

Examples of the photo-polymerization initiator may include a triazine compound, an acetophenone-based compound, a biimidazole-based compound, an active radical generator such as a benzoin-based compound, a benzophenone-based compound, a thioxanthone-based compound, an oxime-based compound, 2,4,6-trimethylbenzoyldiphenylphosphine oxide, 10-butyl-2-chloroacrydone, 2-ethyl anthraquinone, benzyl-9,10-phenanthrenequinone, a camphor quinone, phenylglyoxylic acid methyl ester, a titanocene compound, an acid generator such as an onium salt, or the like. These may be used alone or a combination thereof.

The solvent includes a compound capable of dispersing the first red colorant, the second red colorant, and the yellow colorant with the monomer and the photo-polymerization initiator. Examples of the solvent may include propylene glycol methyl ether acetate ("PGMEA"), propylene glycol methyl ether ("PGME"), or the like.

According to an embodiment, the yellow colorant having the metal complex structure is used to provide improved brightness and the decreased black brightness, and thus the contrast ratio may be improved.

Photoresist Composition-2

The photoresist composition for manufacturing a color filter according to another embodiment includes a first red colorant, a yellow colorant and a second red colorant. The first and second red colorants and the yellow colorant may each be a dye. A red reproducibility of a color filter formed using the photoresist composition may be controlled by a mixture of the first red colorant, the second red colorant and the yellow colorant.

According to an embodiment, the photoresist composition includes a binder such as a binder resin, a monomer, a photo-polymerization initiator and a solvent. The binder, monomer, photo-polymerization initiator and solvent are substantially the same as described above for the "photoresist composition-1." Thus, any repetitive descriptions will be omitted.

The first red colorant is a metal complex having fluorescence and represented by Chemical Formula 2.

Chemical Formula 2

In Chemical Formula 2, $R_3$ and $R_4$ each independently represent a C1 to C10 alkyl group, wherein $A_1, A_2, A_3,$ and $A_4$ each independently represent a C1 to C10 alkyl group, —CN, —PO$_3$H$_2$, —C(O)OH, or a hydrogen atom, m is an integer of 1 to 10, and optionally wherein at least one —CH$_2$— of $R_3$ and $R_4$ if present is independently replaced with —O—, —C(O)—, —C(O)O— or —OC(O)—.

The first red colorant may be fluorescent. The first red colorant having a metal complex structure may have lower fluorescence than the second red colorant, which is an organic compound. Thus, the first red colorant can be fluorescent to improve a brightness of a display apparatus. Additionally while not wanting to be bound by theory, it is believed a light-emitting intensity of the first red colorant is lower than the second red colorant, which is an organic compound, so that the first red colorant may prevent the black brightness from being increased.

The second red colorant is an organic compound and may be fluorescent and examples of the second red colorant may include a xanthene-based compound, a cyanine-based compound, an azo-based compound, a perylene-based compound or a compound represented by Chemical Formula 3.

Chemical Formula 3

In Chemical Formula 3, n represents an integer of 1 to 4, specifically 3 or 4.

Since a light-emitting intensity of the second red colorant is greater than that of the first red colorant, a red represented by the second red colorant is darker than that of the first red colorant. The second red colorant may serve as a component of a red color filter improving a brightness of a display apparatus including the red color filter formed using the photoresist composition. While not wanting to be bound by theory, it is believed the first red colorant and the yellow colorant may support the second red colorant to improve a red color property of the red color filter and to control a black brightness.

The yellow colorant may be substantially the same as the metal complex represented by Chemical Formula 1 and illustrated in the above "photoresist composition-1." Thus, any repetitive descriptions will be omitted. The yellow colorant may decrease the light-emitting intensity of the first and second red colorants by the quenching described earlier.

In the photoresist composition, a brightness (Y) and a color coordinate (x, y) of each of the first and second red colorants and the yellow colorant may be as shown in Table 1.

TABLE 1

|  | Brightness (Y) | Color coordinate (x, y) |
|---|---|---|
| First red colorant | 93.13 | (0.4125, 0.4743) |
| Second red colorant | 58.06 | (0.3364, 0.2380) |
| Yellow colorant | 75.41 | (0.4804, 0.5008) |

While not wishing to be bound by theory, it is believed that the red colorant, which is an organic compound, changes the compound having the metal complex structure represented by Chemical Formula 2 so that an entire brightness of a display apparatus is increased and a black brightness is decreased to improve a contrast ratio.

Hereinafter, properties of the photoresist compositions according to examples will be further described referring to FIG. 2 and FIG. 3.

In an embodiment, a first photoresist composition including an azo-based compound as a first red colorant and a cyanine-based compound as a second red colorant is prepared. Also, a second photoresist composition according to another embodiment which further includes a yellow colorant, in addition to the azo-based compound as a first red colorant and the compound represented by the above Chemical Formula 3 as a second red colorant, is prepared. In addition, a third photoresist composition according to yet another embodiment including a metal complex represented by Chemical Formula 2 as a first red colorant, the compound represented by Chemical Formula 3 as a second red colorant, and a yellow colorant represented by Chemical Formula 1 is prepared. A red color filter is formed using each of the first, second and third photoresist compositions, and a light-transmittance along a wavelength of the red color filters are measured and illustrated in FIG. 2.

Figure 2:
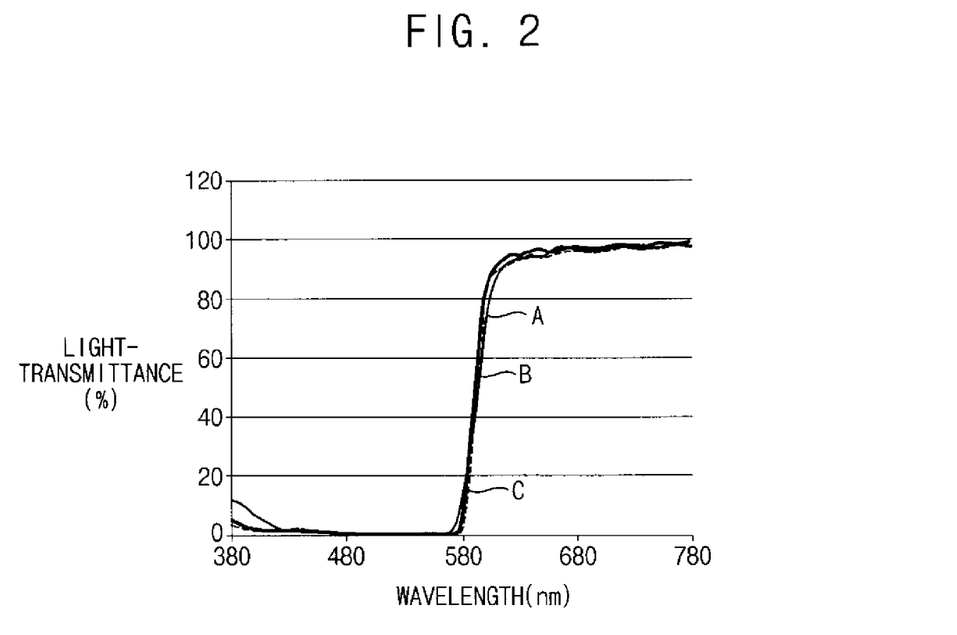
FIG. 2 is a graph illustrating a light-transmittance (percent, %) versus a wavelength (nanometers, m) of color filters formed using photoresist compositions.

FIG. 2 is a graph illustrating a light-transmittance (percent, %) versus a wavelength (nanometers, m) of color filters formed using photoresist compositions.

In FIG. 2, a curve A represents the red color filter formed using the first photoresist composition, a curve B represents the red color filter formed using the second photoresist composition, and a curve C represents the red color filter formed using the third photoresist composition. Referring to FIG. 2, in a wavelength of about 580 nm, the light-transmittance of the curve B is lower than that of the curve A, and the light-transmittance of the curve C is lower than that of the curve B. Thus, the black brightness may be effectively decreased by the red color filters formed using the second and third photoresist compositions, compared to the red color filter formed using the first photoresist composition.

Figure 3:
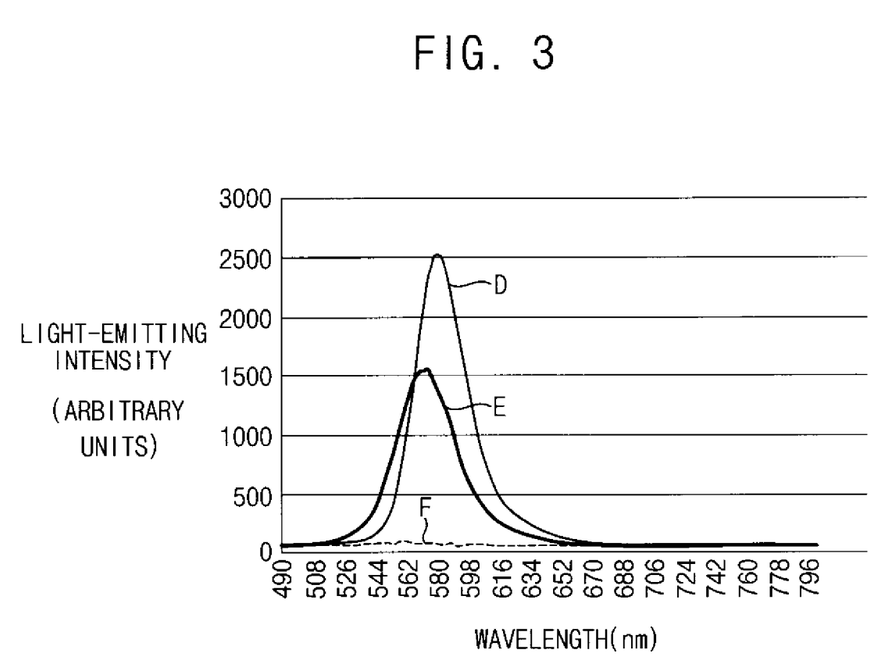
FIG. 3 is a graph illustrating a light-emitting intensity (arbitrary units) versus a wavelength (nanometers, m) of a photoresist composition.

FIG. 3 is a graph illustrating a light-emitting intensity (arbitrary units) versus a wavelength (nanometers, m) of the photoresist compositions.

In FIG. 3, a curve D represents the first photoresist composition, a curve E represents the second photoresist composition, and a curve F represents the third photoresist composition. Referring to FIG. 3, a maximum light-emitting intensity of the second photoresist composition is lower than that of the first photoresist composition. In addition, a maximum light-emitting intensity of the third photoresist composition is lower than that of the second photoresist composition. In particular, as illustrated in curve F, when a light having a wavelength of about 480 nm is provided to the third photoresist composition, the third photoresist composition irradiates less in a range of about 490 nm to about 756 nm.

While not wishing to be bound by theory, it is believed a brightness of a display apparatus including a red color filter formed using the photoresist composition according to an embodiment may be improved and a black brightness may be minimized to improve a display quality.

Display Apparatus

Hereinafter, a structure of a display apparatus including a display substrate according to an embodiment will be illustrated in detail with reference to the accompany drawings.

Figure 4:
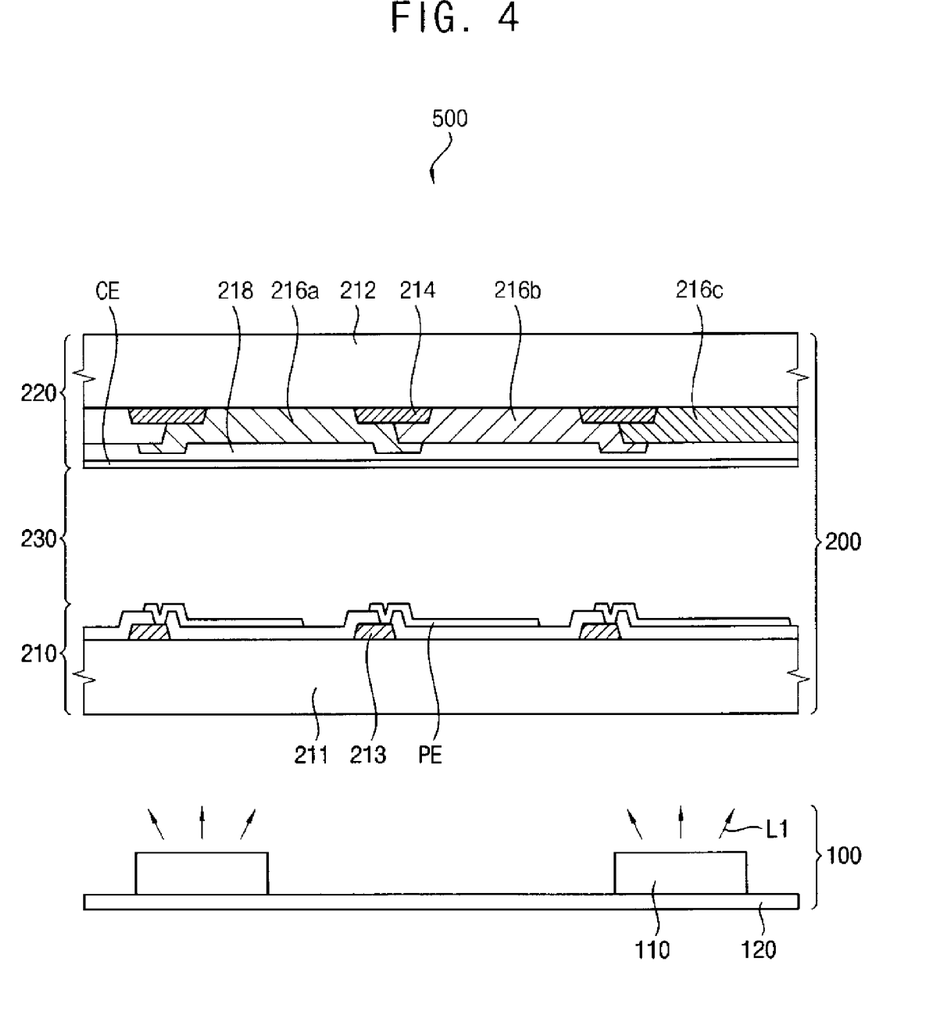
FIG. 4 is a cross-sectional view illustrating a display apparatus including a display substrate in accordance with another embodiment.

FIG. 4 is a cross-sectional view illustrating a display apparatus including a display substrate in accordance with another embodiment.

Referring to FIG. 4, a display apparatus 500 includes a light providing assembly 100 and a display panel 200.

The light providing assembly 100 includes a light-emitting module 110, and the light-emitting module 110 is mounted on a printed circuit board 120 providing a driving signal to the light-emitting module 110. The light-emitting module 110 provides a white light L1 to the display panel 200. Although not shown in figures, the light providing assembly 100 may further include optical sheets and/or optical plates disposed between the light-emitting module 110 and the display panel 200.

The display panel 200 includes a first display substrate 210, a second display substrate 220 and a liquid crystal layer 230. The display panel 200 displays an image using the white light L1 provided from the light providing assembly 100. The second display substrate 220 faces the first display substrate 210, and the liquid crystal layer 230 is interposed between the first and second display substrates 210 and 220. A display substrate according to an embodiment may be the second display substrate 220 as illustrated schematically in FIG. 4.

The first display substrate 210 includes a switching element, e.g. a thin-film transistor 213 formed on a first base substrate 211, a pixel electrode, denoted as PE in FIG. 4, electrically connected to the thin-film transistor 213 and signal lines (not shown). The thin-film transistor 213 may control turning on/off of each pixel cell of the display panel 200. The thin-film transistor 213 includes a control electrode (not shown), an input electrode (not shown), and an output electrode (not shown). The output electrode of thin-film transistor 213 may make contact with the pixel electrode PE. The thin-film transistor 213 is electrically connected to the signal lines.

The second display substrate 220 includes a light-blocking pattern 214 formed on a second base substrate 212 facing the first base substrate 211, color filters 216a, 216b and 216c, an overcoating layer 218 and a common electrode, denoted as CE in FIG. 4.

The light-blocking pattern 214 may be formed in regions of the second base substrate 212 corresponding to the thin-film transistor 213 and the signal lines connected to the thin-film transistor 213 of the first display substrate 210.

The color filters 216a, 216b and 216c may be formed in regions of the second base substrate 212 corresponding to the pixel electrode PE. The color filters 216a, 216b and 216c may include a green color filter 216a, a blue color filter 216b and a red color filter 216c. The green color filter 216a has a maximum light-transmittance in a range of about 400 nanometers (nm) to about 700 nm, specifically about 500 nm to about 600 nm, more specifically of about 550 nm to about 560 nm. Thus, the green color filter 216a transmits light having a wavelength of about 550 nm to about 560 nm and absorbs light except the wavelength of about 550 nm to about 560 nm, to represent green. The blue color filter 216b has a maximum light-transmittance in a range of about 400 nm to about 700 nm, specifically about 410 nm to about 500 nm, more specifically about 420 nm to about 460 nm, and the red color filter 216c has a maximum light-transmittance in a range of about 400 nm to about 700 nm, specifically about 500 nm to about 675 nm, more specifically about 590 nm to about 620 nm.

In an embodiment, the red color filter 216c includes a yellow colorant represented by Chemical Formula 1, a first red colorant and a second red colorant having different structures from each other.

Chemical Formula 1

In Chemical Formula 1, $R_1$ and $R_2$ each independently represent a C1 to C10 alkyl group, wherein $A_1$, $A_2$, $A_3$, and $A_4$ each independently represent a C1 to C10 alkyl group, —CN, —PO$_3$H$_2$, —C(O)OH, or a hydrogen atom, m is an integer of 1 to 10, and optionally wherein at least one —CH$_2$— of $R_1$ and $R_2$ if present is independently replaced with —O—, —C(O)—, —C(O)O—, or —OC(O)—.

Each of the first and second red colorants may independently include a xanthene-based compound, a cyanine-based compound, an azo-based compound, a perylene-based compound or a compound represented by the above Chemical Formula 3.

Chemical Formula 3

In Chemical Formula 3, n represents an integer of 1 to 4, specifically 3 or 4.

The red color filter 216c, as illustrated schematically in FIG. 4, includes the yellow colorant to decrease a light-emitting intensity of the first and second red colorants. Thus, an entire brightness of the display apparatus 500 including the red color filter 216c is increased and a black brightness is decreased to improve a display quality.

The light-emitting module 110, as illustrated schematically in FIG. 4, may include a light-emitting chip substantially generating the light and a light transferring layer covering the light-emitting chip. The light-emitting module 110 may be a light-emitting diode package including a diode chip as the light-emitting chip. The light-emitting chip substantially irradiates a blue light, and the blue light passes through the transferring layer to be transferred to the white light L1. Thus, although the light-emitting chip irradiates the blue light, the light-emitting module 110 substantially provides the white light L1 to the display panel 200. The light-emitting chip may include gallium nitride (GaN) or indium gallium nitride (InGaN). The light transferring layer may include cerium-yttrium aluminum oxide ($Y_3Al_5O_{12}$:Ce), nitride, silicate, or the like.

Since the light-emitting module 110 including the diode chip is used as a light source, the brightness is increased as compared with a cold cathode fluorescent lamp ("CCFL"). However, the white light L1 includes a blue light component so that a color variation may be easily generated, although a viewer recognizes the white light L1 provided to the green, blue and red color filters, 216a, 216b and 216c, respectively. According to an embodiment, in order to improve the brightness and prevent the color variation from being generated, the red color filter 216c is formed using a composition including the xanthene-based compound, the cyanine-based compound, the azo-based compound, the perylene-based compound or the compound represented by the above Chemical Formula 3. By using the above compounds, the brightness is increased because of the fluorescence of the above compounds, and thus the black brightness is increased, decreasing the contrast ratio. Also, a compound having a metal complex structure such as the yellow colorant is used in forming the red color filter 216c to decrease the black brightness.

Alternatively, the red color filter 216c may include a first red colorant of a metal complex structure represented by Chemical Formula 2, a yellow colorant and a second red colorant. The yellow colorant may have a metal complex structure represented by the above Chemical Formula 1, and the second red colorant may include a compound represented by Chemical Formula 3.

Chemical Formula 2

In Chemical Formula 2, $R_3$ and $R_4$ each independently represent a C1 to C10 alkyl group, wherein $A_1$, $A_2$, $A_3$, and $A_4$ each independently represent a C1 to C10 alkyl group, —CN, —$PO_3H_2$, —C(O)OH, or a hydrogen atom, m is an integer of 1 to 10, and optionally wherein at least one —$CH_2$— of $R_3$ and $R_4$ if present is independently replaced with —O—, —C(O)—, —C(O)O— or —OC(O)—.

Chemical Formula 3

In Chemical Formula 3, n represents an integer of 3 or 4.

The red color filter 216c has a thickness in a range of about 1.0 micrometer (μm) to about 3.5 μm, specifically about 1.5 μm to about 3.0 μm, more specifically about 2.0 μm to about 2.5 μm, so that the yellow colorant may more easily support a light extinction of the first and second red colorants. Thus, the yellow colorant more easily receives and absorbs the energies of the first and second red colorants in the above thickness range to decrease the black brightness. For example, considering an entire brightness of the display apparatus 500, a light-transmittance of the red color filter 216c, a color reproducibility, and the thickness of the red color filter 216c may be about 1.5 μm and about 3.0 μm. When the red color filter 216c is included in the second display substrates 220, the thickness of the red color filter 216c may be about 2.0 μm to about 4.0 μm, specifically about 1.5 μm to about 3.0 μm, more specifically about 1.0 μm and about 2.0 μm.

While not wishing to be bound by theory, it is believed the entire brightness of the display apparatus 500 is improved by the red color filter 216c, and the black brightness is decreased, to improve the display quality.

Figure 5:
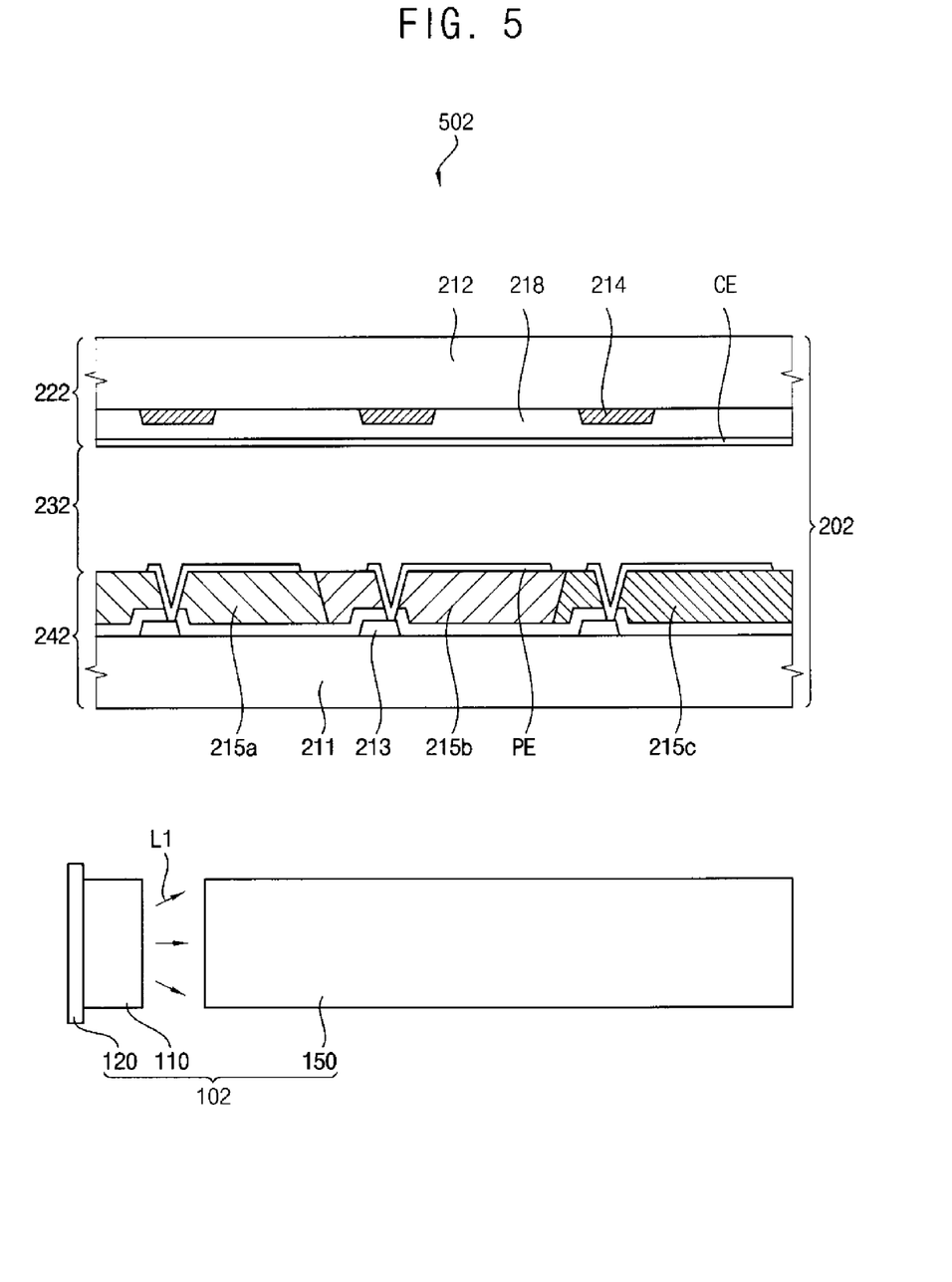
FIG. 5 is a cross-sectional view illustrating a display apparatus including a display substrate in accordance with still another embodiment.

FIG. 5 is a cross-sectional view illustrating a display apparatus including a display substrate in accordance with still another embodiment.

Referring to FIG. 5, a display apparatus 502 includes a light providing assembly 102 and a display panel 202.

The light providing assembly 102 is substantially the same as the light providing assembly 100 in FIG. 4, except for including an edge type light guide plate 150. Thus, any repetitive descriptions will be omitted. A light-emitting module 110 of the light providing assembly 102 is disposed in a region corresponding to an edge portion of the display panel 202. The light guide plate 150 facing the display panel 202 may guide a light of the light-emitting module 110 to the display panel 202.

The display panel 202 includes a first display substrate 242, a second display substrate 222 and a liquid crystal layer 232. The first display substrate 242 includes a switching element, e.g. a thin-film transistor 213 formed on a first base substrate 211, a green color filter 215a, a blue color filter 215b, a red color filter 215c and a pixel electrode, denoted as PE in FIG. 5. The green color filter 215a and the blue color filter 215b may be disposed at both side portions of the red color filter 215c.

The red color filter 215c as illustrated schematically in FIG. 5, is substantially the same as the red color filter 216c in FIG. 4 except for being formed on the first base substrate 211, and thus any repetitive descriptions will be omitted.

The red color filter 215c is formed between the thin-film transistor 213 and the pixel electrode PE. The red color filter 215c covers the thin-film transistor 213, and the pixel electrode PE is formed on the red color filter 215c. The red color filter 215c may planarize a surface of the first display substrate 242. In an embodiment, the red color filter 215c has a thickness in a range of about 1.5 μm to about 4.0 μm, specifically about 2.0 μm to about 3.5 μm, more specifically about 2.5 μm to about 3.0 μm.

Without wishing to be bound by theory, it is believed the red color filter 215c of the first display substrate 102 is used so that an entire brightness of the display apparatus 502 is increased and a black brightness is decreased, to improve a display quality.

Although not shown in figures, the light providing assembly 102 in FIG. 5 is combined with the display panel 200 in FIG. 4 to provide a display apparatus different from the display apparatuses 500 and 502 in FIGS. 4 and 5, respectively.

According to an embodiment, a fluorescent metal complex including a metal is used as a red colorant for forming a red color filter. Thus, a brightness of a white display mode is increased and a light emitting intensity of a black display mode is decreased, to improve a contrast ratio.

In addition, a metal complex is used as a yellow colorant for forming the red color filter so that the red colorant may not fluoresce since the red colorant is quenched by the yellow colorant when the red colorant is excited. Therefore, the brightness of the black display mode is decreased to improve the contrast ratio.

The foregoing is illustrative of the present disclosure and shall not to be construed as limiting thereof. Although embodiments have been described, those skilled in the art will readily appreciate that various changes and modifications can be made by one of ordinary skill in the art without departing from the novel teachings and advantages of disclosed embodiments. Accordingly, all such changes and modifications are intended to be included within the scope of the invention as defined in the appended claims. In the claims, means-plus-function clauses are intended to cover the structures described herein as performing the recited function and not only structural equivalents but also equivalent structures. Therefore, it is to be understood that the foregoing is illustrative of the invention and is not to be construed as limited to the particular embodiments disclosed, and that modifications to the disclosed embodiments, as well as other embodiments, are intended to be included within the scope of the appended claims.

What is claimed is:

1. A photoresist composition for manufacturing a color filter, the photoresist composition comprising:
   a first red colorant; and
   a yellow colorant represented by Chemical Formula 1, Chemical Formula 1 wherein $R_1$ and $R_2$ each independently represent a C1 to C10 alkyl group, wherein $A_1$, $A_2$, $A_3$, and $A_4$ each independently represent a C1 to C10 alkyl group, —CN, —PO$_3$H$_2$, —C(O)OH, or a hydrogen atom, m is an integer of 1 to 10, and optionally wherein at least one —CH$_2$— of $R_1$ and $R_2$ if present is independently replaced with —O—, —C(O)—, —C(O)O—, or —OC(O)—.

2. The photoresist composition of claim 1, wherein the first red colorant is represented by Chemical Formula 2, Chemical Formula 2 wherein $R_3$ and $R_4$ each independently represent a C1 to C10 alkyl group, wherein $A_1$, $A_2$, $A_3$, and $A_4$ each independently represent a C1 to C10 alkyl group, —CN, —PO$_3$H$_2$, —C(O)OH, or a hydrogen atom, m is an integer of 1 to 10, and optionally wherein at least one —CH$_2$— of $R_3$ and $R_4$ if present is independently replaced with —O—, —C(O)—, —C(O)O—, or —OC(O)—.

3. The photoresist composition of claim 2, further comprising a second red colorant comprising at least one of a xanthene compound, a cyanine compound, an azo compound, a perylene compound or a compound represented by Chemical Formula 3,

Chemical Formula 3 wherein n represents an integer of 3 or 4.

4. The photoresist composition of claim 1, wherein the first red colorant comprises at least one of a xanthene compound, a cyanine compound, an azo compound, a perylene compound or a compound represented by Chemical Formula 3, Chemical Formula 3 wherein n represents an integer of 3 or 4.

5. The photoresist composition of claim 1, further comprising a photo-polymerization initiator, a monomer, a binder, and a solvent.

6. A photoresist composition for manufacturing a color filter, the photoresist composition comprising:

a yellow colorant and a first red colorant represented by Chemical Formula 2,

Chemical Formula 2 wherein $R_3$ and $R_4$ each independently represent a C1 to C10 alkyl group, wherein $A_1$, $A_2$, $A_3$, and $A_4$ each independently represent a C1 to C10 alkyl group, —CN, —PO$_3$H$_2$, —C(O)OH, or a hydrogen atom, m is an integer of 1 to 10, and optionally wherein at least one —CH$_2$— of $R_3$ and $R_4$ if present is independently replaced with —O—, —C(O)—, —C(O)O—, or —OC(O)—.

7. The photoresist composition of claim 6, further comprising a second red colorant represented by Chemical Formula 3, Chemical Formula 3 wherein n represents an integer of 3 or 4.

8. The photoresist composition of claim 6, further comprising a second red colorant comprising at least one of a xanthene compound, a cyanine compound, an azo compound, or a perylene compound.

9. A display substrate comprising:
a red color filter comprising a first red colorant and a yellow colorant represented by Chemical Formula 1, Chemical Formula 1 wherein $R_1$ and $R_2$ each independently represent a C1 to C10 alkyl group, wherein $A_1, A_2, A_3,$ and $A_4$ each independently represent a C1 to C10 alkyl group, —CN, —PO$_3$H$_2$, —C(O)OH, or a hydrogen atom, m is an integer of 1 to 10, and optionally wherein at least one —CH$_2$— of $R_1$ and $R_2$ if present is independently replaced with —O—, —C(O)—, —C(O)O—, or —OC(O)—.

10. The display substrate of claim 9, wherein the first red colorant is represented by Chemical Formula 2, Chemical Formula 2 wherein $R_3$ and $R_4$ each independently represent a C1 to C10 alkyl group, wherein $A_1, A_2, A_3,$ and $A_4$ each independently represent a C1 to C10 alkyl group, —CN, —PO$_3$H$_2$, —C(O)OH, or a hydrogen atom, m is an integer of 1 to 10, and optionally wherein at least one —CH$_2$— of $R_3$ and $R_4$ if present is independently replaced with —O—, —C(O)—, —C(O)O—, or —OC(O)—.

11. The display substrate of claim 10, wherein the red color filter further comprises a second red colorant comprising at least one of a xanthene compound, a cyanine compound, an azo compound, a perylene compound or a compound represented by Chemical Formula 3,

Chemical Formula 3 wherein n represents an integer of 3 or 4.

12. The display substrate of claim 9, wherein the first red colorant comprises at least one of a xanthene compound, a cyanine compound, an azo compound, a perylene compound, or a compound represented by Chemical Formula 3, Chemical Formula 3 wherein n represents an integer of 3 or 4.

13. The display substrate of claim 9, further comprising:
a switching element formed on a base substrate; and
a pixel electrode electrically connected to the switching element,
wherein the red color filter is disposed between the switching element and the pixel electrode.

14. The display substrate of claim 9, further comprising a common electrode formed on the red color filter.

15. The display substrate of claim 9, wherein the red color filter has a thickness in a range of about 1.0 micrometer to about 3.5 micrometers.

16. A display substrate comprising:
a red color filter comprising a yellow colorant and a first red colorant represented by Chemical Formula 2;

Chemical Formula 2 wherein $R_3$ and $R_4$ each independently represent a C1 to C10 alkyl group, wherein $A_1$, $A_2$, $A_3$, and $A_4$ each independently represent a C1 to C10 alkyl group, —CN, —PO$_3$H$_2$, —C(O)OH, or a hydrogen atom, m is an integer of 1 to 10, and optionally wherein at least one —CH$_2$— of $R_3$ and $R_4$ if present is independently replaced with —O—, —C(O)—, —C(O)O—, or —OC(O)—.

17. The display substrate of claim 16, wherein the red color filter further comprises a second red colorant represented by Chemical Formula 3;

Chemical Formula 3 wherein n represents an integer of 3 or 4.

18. The display substrate of claim 16, further comprising:
a switching element disposed on a base substrate; and
a pixel electrode connected to the switching element,
wherein the red color filter is disposed between the switching element and the pixel electrode.

19. The display substrate of claim 16, further comprising a common electrode disposed on the red color filter.

20. The display substrate of claim 16, wherein the red color filter has a thickness in a range of about 1.0 micrometer to about 3.5 micrometers.

* * * * *